(12) United States Patent
Yu et al.

(10) Patent No.: US 11,011,517 B2
(45) Date of Patent: May 18, 2021

(54) SEMICONDUCTOR STRUCTURE INCLUDING FIRST FINFET DEVICES FOR LOW POWER APPLICATIONS AND SECOND FINFET DEVICES FOR HIGH POWER APPLICATIONS

(71) Applicant: International Business Machines Corporation, Armonk, NY (US)

(72) Inventors: Lan Yu, Voorheesville, NY (US); Junli Wang, Slingerlands, NY (US); Heng Wu, Guilderland, NY (US); Ruqiang Bao, Niskayuna, NY (US); Dechao Guo, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 30 days.

(21) Appl. No.: 16/238,223

(22) Filed: Jan. 2, 2019

(65) Prior Publication Data

US 2020/0212037 A1   Jul. 2, 2020

(51) Int. Cl.
| | |
|---|---|
| *H01L 27/092* | (2006.01) |
| *H01L 29/10* | (2006.01) |
| *H01L 29/06* | (2006.01) |
| *H01L 21/3065* | (2006.01) |
| *H01L 21/8238* | (2006.01) |

(Continued)

(52) U.S. Cl.
CPC .... *H01L 27/0922* (2013.01); *H01L 21/02532* (2013.01); *H01L 21/308* (2013.01); *H01L 21/3065* (2013.01); *H01L 21/823807* (2013.01); *H01L 21/823821* (2013.01);

(Continued)

(58) Field of Classification Search
CPC ............... H01L 27/0922; H01L 21/308; H01L 29/0653; H01L 21/02532; H01L 21/823821; H01L 21/823878; H01L 21/3065; H01L 21/823807; H01L 27/0924; H01L 29/1037; H01L 29/66545; H01L 21/82385
See application file for complete search history.

(56) References Cited

U.S. PATENT DOCUMENTS

| 8,354,320 B1 | 1/2013 | Xie et al. |
| 8,941,153 B2 | 1/2015 | Lee et al. |

(Continued)

FOREIGN PATENT DOCUMENTS

WO   2017078676 A1   5/2017

OTHER PUBLICATIONS

Abrishami, et al., "Optimal Choice of FinFET Devices for Energy Minimization in Deeply-Scaled Technologies", Sixteenth International Symposium on Quality Electronic Design, Date of Conference: Mar. 2-4, 2015, 5 pages.

*Primary Examiner* — Cuong B Nguyen
*Assistant Examiner* — Juanita B Rhodes
(74) *Attorney, Agent, or Firm* — Scully, Scott, Murphy & Presser, P.C.; L. Jeffrey Kelly, Esq.

(57) ABSTRACT

A semiconductor structure is provided that includes a first FinFET device for low power applications and a second FinFET device for non-low power applications. The first FinFET device has an active fin height, i.e., channel height, which is less that an active fin height of the second FinFET device. The active fin height adjustment is achieved utilizing an isolation structure that has a constant height in the region including the first FinFET device and the region including the second FinFET device.

11 Claims, 4 Drawing Sheets

(51) Int. Cl.
  *H01L 21/02* (2006.01)
  *H01L 21/308* (2006.01)
(52) U.S. Cl.
  CPC .. *H01L 21/823878* (2013.01); *H01L 27/0924* (2013.01); *H01L 29/0653* (2013.01); *H01L 29/1037* (2013.01)

(56) References Cited

U.S. PATENT DOCUMENTS

| | | |
|---|---|---|
| 9,263,528 B2 | 2/2016 | Vincent |
| 9,331,159 B1 | 5/2016 | Jha et al. |
| 9,418,903 B2 | 8/2016 | Divakaruni et al. |
| 9,530,654 B2 | 12/2016 | Licausi |
| 9,953,880 B1 | 4/2018 | Lin et al. |
| 9,985,021 B2 | 5/2018 | Bi et al. |
| 2004/0222477 A1 | 11/2004 | Aller et al. |
| 2009/0085121 A1 | 4/2009 | Park et al. |
| 2011/0133292 A1 | 6/2011 | Lee et al. |
| 2015/0108616 A1* | 4/2015 | Greene ............... H01L 21/0262 257/623 |
| 2015/0287809 A1* | 10/2015 | Kerber ................. H01L 21/845 438/479 |
| 2016/0049468 A1* | 2/2016 | Wu ................... H01L 21/76224 257/401 |
| 2016/0141205 A1* | 5/2016 | Chiang ............. H01L 21/28017 438/424 |
| 2018/0053824 A1* | 2/2018 | Wang ................ H01L 21/76224 |

\* cited by examiner

SEMICONDUCTOR STRUCTURE INCLUDING FIRST FINFET DEVICES FOR LOW POWER APPLICATIONS AND SECOND FINFET DEVICES FOR HIGH POWER APPLICATIONS

BACKGROUND

The present application relates to a semiconductor structure and a method of forming the same. More particularly, the present application relates to a semiconductor structure including a first FinFET (FET=field effect transistor) device for low power applications having a first active fin height and a second FinFET device for non-low power applications having a second active fin height that is greater than the first active fin height and a method of forming the same.

With device architecture switching from planar to FinFET, the minimum device width ($W_{eff}$) has been actually reverse scaled due to the Fin effect (i.e., minimum width ($W_{eff}$)/footprint). However, a minimum width device is required for logic circuits to follow the scaling trend for power reduction. Typical examples are latches and local clock buffers.

The most promising way to reduce power consumption of an on-chip clock FinFET device is to reduce the active fin height which in turn reduces the $W_{eff}$. The prior art relies on providing an isolation structure that has a dual height in order to fabricate FinFET devices with different active fin heights. Such prior art requires a complicated integration flow in order to provide the dual height isolation structure and dual punch-through stop (PTS) implants are needed so as to reduce sub-Fin leakage.

There is thus a need for a method that can provide active fin height adjustment for minimum device width applications that avoids the use of dual height isolation structures and dual PTS implants.

SUMMARY

A semiconductor structure is provided that includes a first FinFET device for low power applications and a second FinFET device for non-low power applications. The first FinFET device has an active fin height, i.e., channel height, which is less that an active fin height of the second FinFET device. The active fin height adjustment is achieved utilizing an isolation structure that has a constant height in the region including the first FinFET device and the region including the second FinFET device.

In one aspect of the present application, a semiconductor structure is provided. In one embodiment, the semiconductor structure includes at least one first fin structure located in a first region of a semiconductor substrate, and at least one second fin structure located in a second region of the semiconductor substrate. The semiconductor structure further includes an isolation structure located on the semiconductor substrate and laterally surrounding a lower portion of the first fin structure and a lower portion of the second fin structure. In accordance with the present application, the isolation structure has a constant thickness across the first region and the second region, and the at least one first fin structure has a first active fin height and the at least one second fin structure has a second active fin height that is greater than the first active fin height.

In another aspect of the present application, a method of forming a semiconductor structure is provided. In one embodiment, the method includes forming an opening in a first region of a semiconductor substrate composed of a first semiconductor material. A second semiconductor material that is compositionally different from the first semiconductor material of the semiconductor substrate is then formed in the opening. The second semiconductor material has a topmost surface that is coplanar with a topmost surface of the semiconductor substrate. At least one semiconductor fin stack including a lower fin portion composed of the first semiconductor material and an upper fin portion composed of the second semiconductor material is formed in the first region of the semiconductor substrate, and at least one second fin structure composed entirely of a fin portion of the first semiconductor material is formed in a second region of the semiconductor substrate. Next, an isolation structure is formed surrounding a bottom portion of the at least one semiconductor fin stack and a bottom portion of the at least one second fin structure. After forming the isolation structure, the upper fin portion is entirely removed from the at least one semiconductor fin stack to provide at least one first fin structure in the first region, wherein the at least one first fin structure has an active fin height that is less than an active fin height of the at least one second fin structure. The at least one first fin structure is composed entirely of the lower fin portion composed of the first semiconductor material.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
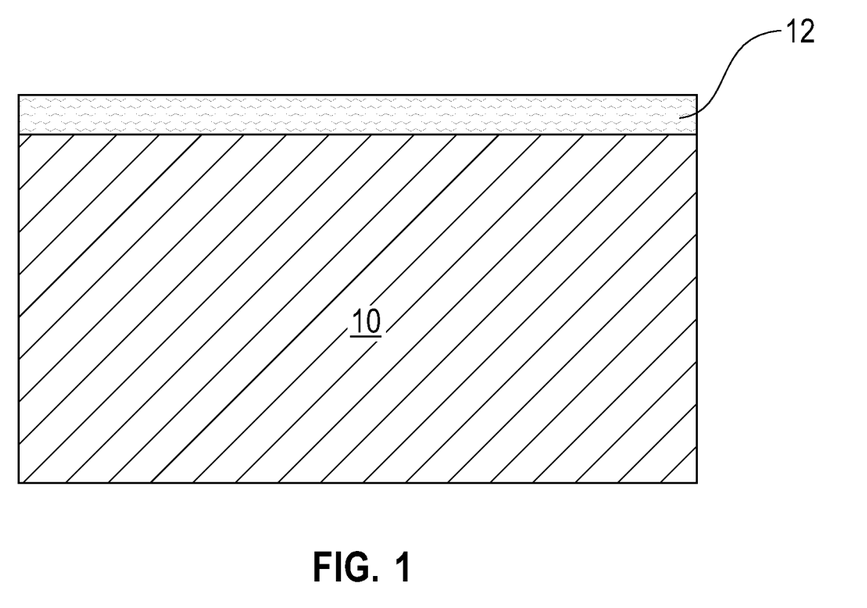
FIG. 1 is a cross sectional view of an exemplary semiconductor structure that can be employed in the present application and including a first hard mask layer located on a surface of a semiconductor substrate composed of a first semiconductor material.

Referring first to FIG. 1, there is illustrated an exemplary semiconductor structure that can be employed in the present application. The exemplary semiconductor structure of FIG. 1 includes a first hard mask layer 12 located on a surface of a semiconductor substrate 10 that is composed of a first semiconductor material.

The term "semiconductor material" as used throughout the present application denotes any material that has semiconducting properties. Illustrative examples of semiconductor materials that can be used as the first semiconductor material that provides semiconductor substrate 10 include silicon (Si), germanium (Ge), silicon germanium alloys (SiGe), silicon carbide (SiC), silicon germanium carbide (SiGeC), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In one embodiment, the first semiconductor material that provides the semiconductor substrate 10 is composed of silicon.

The hard mask layer 12 is composed of hard mask material such as, for example, silicon dioxide, silicon nitride, and/or silicon oxynitride. In one embodiment, the hard mask layer 12 may be formed utilizing a deposition process such as, for example, chemical vapor deposition (CVD), plasma enhanced chemical vapor deposition (PECVD), physical vapor deposition (PVD), or atomic layer deposition (ALD). In another embodiment, the hard mask layer 12 may be formed by a thermal process such as, for example, thermal oxidation or thermal nitridation. In yet another embodiment, the hard mask layer 12 may be formed utilizing a combination of a deposition process and a thermal process. The hard mask layer 12 is a continuous layer that covers an entire topmost surface of the semiconductor substrate 10. The hard mask layer 12 may have a thickness from 20 nm to 50 nm. Other thicknesses are possible and can be used as the thickness of the hard mask layer 12.

Figure 2:
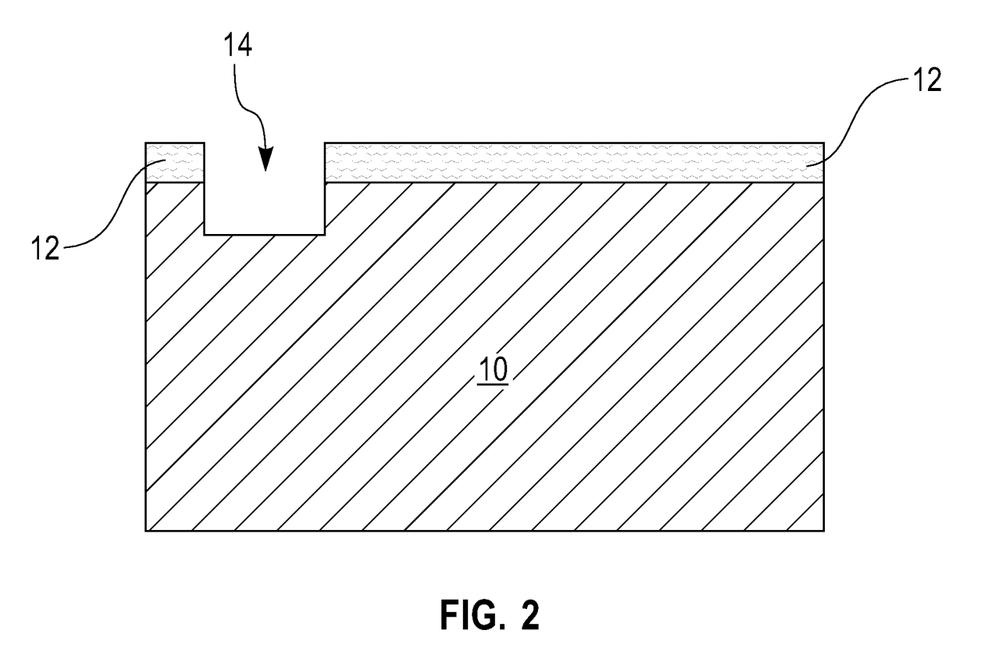
FIG. 2 is a cross sectional view of the exemplary semiconductor structure of FIG. 1 after forming an opening in a first region of the semiconductor substrate.

Referring now to FIG. 2, there is illustrated the exemplary semiconductor structure of FIG. 1 after forming an opening 14 in a first region of the semiconductor substrate 10. As is shown, the opening 14 extends completely through the hard mask layer 12 and partially within the semiconductor substrate 10 such that a sidewall and a sub-surface of the semiconductor substrate 10 are exposed. No such opening is formed in a second region of the semiconductor substrate 10 that is laterally adjacent to the first region. It is noted that although the present application describes and illustrates a single opening 14, the present application can be employed when a plurality of spaced apart openings 14 are formed in other regions of the semiconductor substrate 10 besides the first and second regions.

The first region (i.e., first device region) of the semiconductor substrate 10 is an area in which a first conductivity type device, i.e., n-type field effect transistor (nFET) or a p-type field effect transistor (pFET) will be subsequently formed, while the second region (i.e., second device region) is an area of the semiconductor substrate in which a second conductivity type device that is opposite from the first conductivity type device will be subsequently formed.

The opening 14 may be formed by lithographic patterning. Lithographic patterning includes forming a photoresist material (not shown) on a surface of a material or materials that need to be patterned, exposing the photoresist material to a desired pattern of irradiation, developing the exposed photoresist to provide a patterned photoresist, and transferring the pattern from the patterned photoresist into the underlying material or materials that need to be patterned. The transferring of the pattern may be achieved utilizing an etching process such as, for example, a dry etching process, a wet chemical etching process or a combination of dry etching and wet chemical etching. Typically, a reactive ion etch is used in the pattern transfer step.

The depth of the opening 14, as measured from the topmost surface of the semiconductor substrate 10 to the physically exposed sub-surface of the semiconductor substrate 10 can be from 10 nm to 50 nm. Other depths for the opening 14 are possible and can be used in the present application. The width and length of the opening may vary. It is noted that the depth of the opening 14 will determine the final fin height of the first fin structure formed in the first region of the semiconductor substrate 10.

Figure 3:
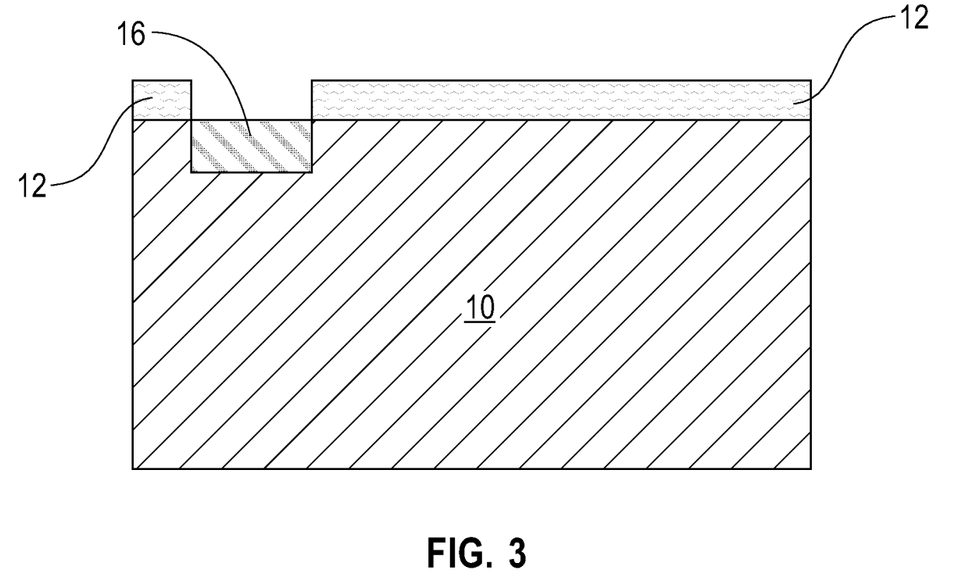
FIG. 3 is a cross sectional view of the exemplary semiconductor structure of FIG. 2 after epitaxially growing a second semiconductor material that differs from the first semiconductor material in the opening.

Referring now to FIG. 3, there is shown the exemplary semiconductor structure of FIG. 2 after epitaxially growing a second semiconductor material 16 that differs from the first semiconductor material in the opening 14. The second semiconductor material 16 includes one of the semiconductor materials mentioned above for the first semiconductor material that provides semiconductor substrate 10 provided that the second semiconductor material 16 is compositionally different from the first semiconductor material. In one example, and when the first semiconductor material that provides the semiconductor substrate 10 is composed of silicon, then the second semiconductor material 16 is composed of a silicon germanium alloy.

The term "epitaxially growing" means the growth of one semiconductor material (e.g., the second semiconductor material 16) on a growth surface of another semiconductor material (e.g., the first semiconductor material that provides semiconductor substrate 10), in which the one semiconductor material being grown has the same crystalline characteristics as the growth surface of the other semiconductor material. In a growth process, the chemical reactants provided by the source gases are controlled and the system parameters are set so that the depositing atoms arrive at the growth surface of the other semiconductor material with sufficient energy to move around on the growth surface and orient themselves to the crystal arrangement of the atoms of the growth surface. Therefore, an epitaxially grown semiconductor material has the same crystalline characteristics as the growth on surface on which it is formed. In the present application, the second semiconductor material 16 has a same crystalline characteristics as the first semiconductor material that provides the semiconductor substrate 10.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth of the second semiconductor material 16 can be performed utilizing any well-known precursor gas or gas mixture. Carrier gases like hydrogen, nitrogen, helium and argon can be used.

After epitaxial growth of the second semiconductor material 16, the second semiconductor material typically has a topmost surface that extends above the topmost surface of the semiconductor substrate 10. In one embodiment, the second semiconductor material 16 has a topmost surface that is located between the topmost surface and the bottommost surface of the patterned hard mask layer 12. The second semiconductor material 16 may have an as grown thickness of from 20 nm to 100 nm. Other thicknesses are possible and can be used in the present application as the thickness of the second semiconductor material 16.

Figure 4:
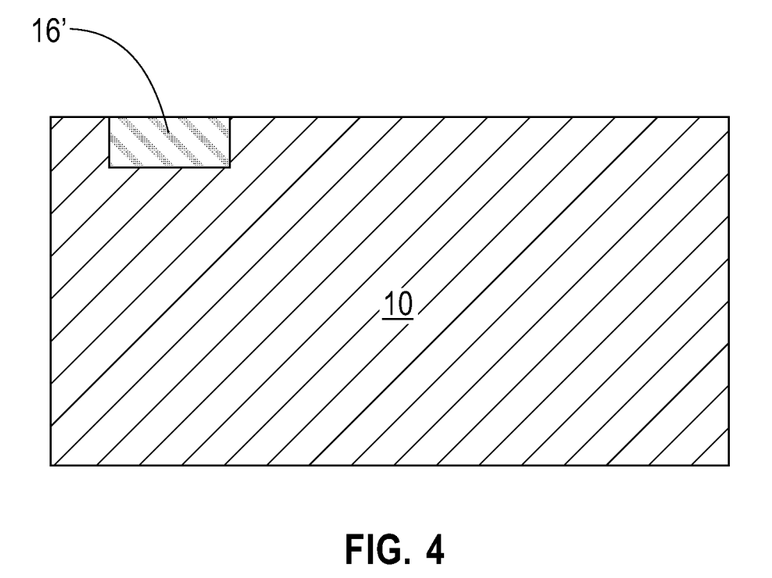
FIG. 4 is a cross sectional view of the exemplary semiconductor structure of FIG. 3 after performing a planarization process.

Referring now to FIG. 4, there is illustrated the exemplary semiconductor structure of FIG. 3 after performing a planarization process. The planarization process removes the patterned hard mask layer 12 and an upper portion of the second semiconductor material 16 that extends above the topmost surface of the semiconductor substrate 10 from the structure. The planarization process may include chemical mechanical polishing (CMP) and/or grinding. The remaining second semiconductor material (now labeled as element 16') has a topmost surface that is coplanar with a topmost surface of the semiconductor substrate 10.

Figure 5:
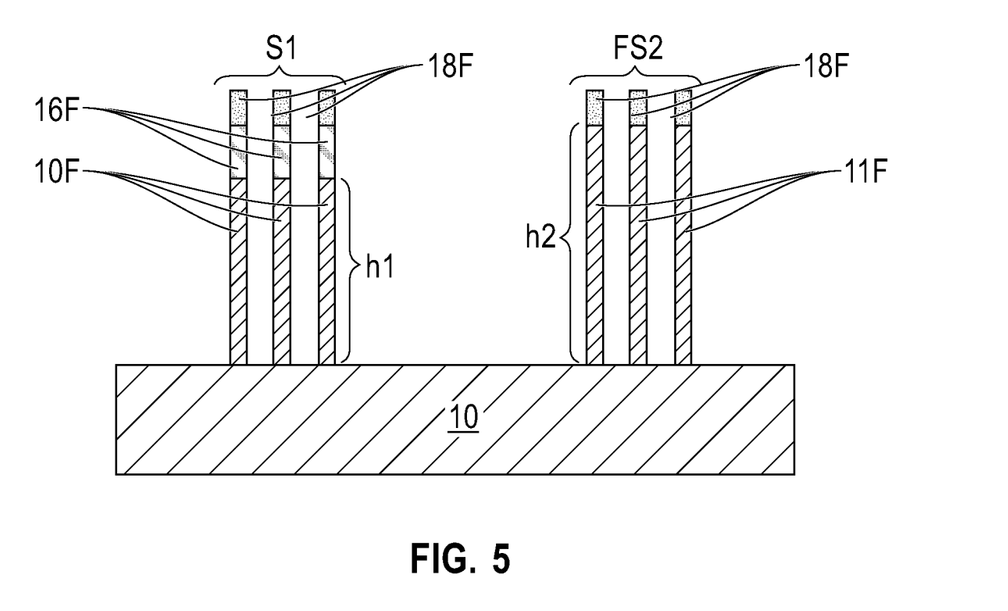
FIG. 5 is a cross sectional view of the exemplary semiconductor structure of FIG. 4 after forming at least one semiconductor fin stack including a lower fin portion composed of the first semiconductor material and an upper fin portion composed of the second semiconductor material in the first region of the semiconductor substrate, and at least one second fin structure composed entirely of a fin portion composed of the first semiconductor material in a second region of the semiconductor substrate.

Referring now to FIG. 5, there is illustrated the exemplary semiconductor structure of FIG. 4 after forming at least one semiconductor fin stack, S1, including a lower fin portion 10F composed of the first semiconductor material and an upper fin portion 16F composed of the second semiconductor material in the first region of the semiconductor substrate 10, and forming at least one second fin structure, FS2, composed entirely of a fin portion 11F composed of the first semiconductor material in a second region of the semiconductor substrate 10. The at least one semiconductor fin stack, S1, and the at least one second fin structure, FS2, are capped with a hard mask cap 18F. The at least one semiconductor fin stack, S1, will be subsequently processed into a first fin structure, FS1.

The forming of the at least one semiconductor fin stack, S1, and the at least one second fin structure, FS2, includes forming a second hard mask layer (not shown) on the physically exposed surfaces of the exemplary semiconductor structure shown in FIG. 4. The second hard mask layer, which is used in providing the hard mask caps 18F, may include one of the hard mask materials mentioned above for the first hard mask layer 12. The second hard mask layer may be formed utilizing one of the techniques mentioned above for forming the first hard mask layer 12. The second hard mask layer may have a thickness that is within the thickness range mentioned above for the first hard mask layer. Following the formation of the second hard mask layer, a patterning process is performed. In one embodiment, the patterning process includes photolithography as defined above. In another embodiment, the patterning process includes a sidewall image transfer (SIT) process. In yet another embodiment, the patterning process includes a direct self-assembly (DSA) patterning process.

Notwithstanding the type of patterning process employed, the patterning process patterns the second hard mask layer, the second semiconductor material 16 and a portion of the semiconductor substrate 10 that are present in the first region so as to form the at least one semiconductor fin stack, S1, including the lower fin portion 10F and the upper fin portion 16F which is capped with a hard mask cap 18F. The lower fin portion 10F includes a remaining portion of the first semiconductor material that provides the semiconductor substrate 10, the upper fin portion 16F includes a remaining portion of the second semiconductor material 16, and the hard mask cap 18F includes a remaining portion of the second hard mask layer. The lower fin portion 10F has a first height, h1; the first height is a total fin height as measured from a topmost surface to a bottommost surface of the lower fin portion 10F. In one embodiment, the first height, h1, of the lower fin portion 10F can be from 50 nm to 110 nm.

The patterning process also patterns the second hard mask layer and a portion of semiconductor substrate 10 that are present in the second region so as to form the at least one second fin structure, FS2, composed entirely of the fin portion 11F composed of the first semiconductor material. The fin portion 11F has a second height, h2, which is greater than the first height. In one embodiment, the second height, h2, of the fin portion 11F can be from 60 nm to 120 nm; the second height is a total fin height as measured from a topmost surface to a bottommost surface of the fin portion 11F.

The phrase "fin structure" is used in the present application to define a structure including a pair of vertical sidewalls that are parallel to each other. A surface is "vertical" if there exists a vertical plane from which the surface does not deviate by more than three times the root mean square roughness of the surface. The at least one semiconductor fin stack, S1, also includes a pair of vertical sidewalls that are parallel to each other. The at least one semiconductor fin stack, Si, and the at least one second fin structure, FS2, may have width from 5 nm to 30 nm, and a length from 20 nm to 200 nm. Other widths and/or lengths that are lesser than, or greater than, the ranges mentioned herein can also be used in the present application.

Although the present application illustrates forming a plurality of semiconductor fin stacks, FS1, in the first region and a plurality of second fin structures, FS2, in the second region, the present application can work when only a single semiconductor fin stacks and/or a single second fin structure are formed.

Figure 6:
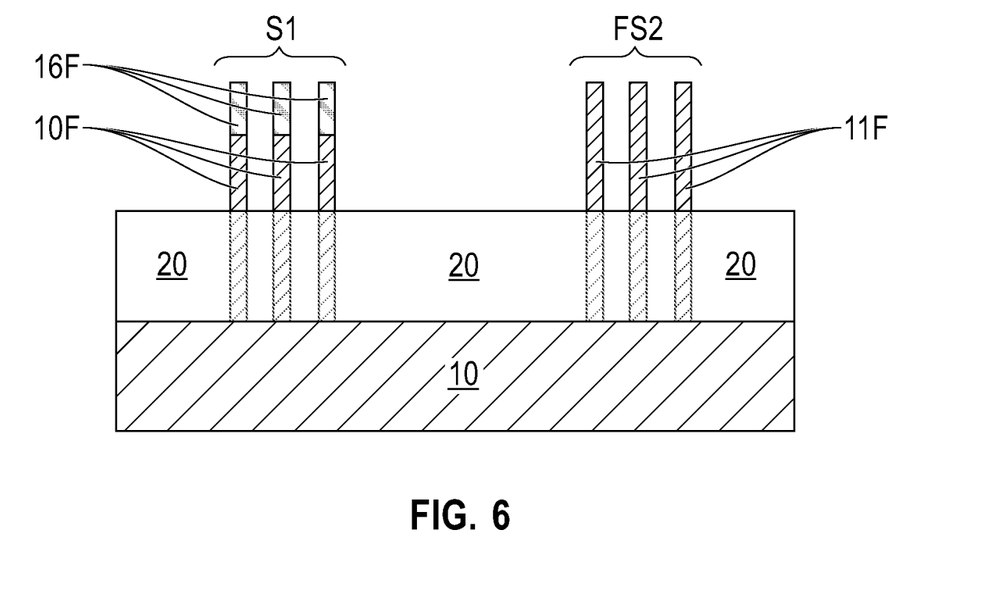
FIG. 6 is a cross sectional view of the exemplary semiconductor structure of FIG. 5 after forming an isolation structure surrounding a bottom portion of the at least one semiconductor fin stack and a bottom portion of the at least one second fin structure.

Referring now to FIG. 6, there is illustrated the exemplary semiconductor structure of FIG. 5 after forming an isolation structure 20 surrounding a bottom portion of the at least one semiconductor fin stack, S1, and a bottom portion of the at least one second fin structure, FS2. In the drawings, the isolation structure 20 is drawn having some transparency so as to see the lower portion of the lower fin portion 10F of the semiconductor fin stack, S1, and the lower portion of the fin portion 11F of the second fin structure, FS2.

The isolation structure 20 has a constant thickness, i.e., height, across the first region and the second region. The isolation structure 20 may include any dielectric material such as, for example, silicon dioxide or silicon nitride. The isolation structure 20 may be formed by depositing a dielectric material, and optionally performed an etch back process. The etch back process may also remove the first hard mask cap 18F from the at least one semiconductor fin stack, S1, and the at least one second fin structure, FS2. In other embodiments, the hard mask caps 18F can be removed after forming the isolation structure 20 utilizing a selective etching process. The depositing of the dielectric material may include CVD or PECVD. The isolation structure 20 may have a thickness from 20 nm to 50 nm.

Figure 7:
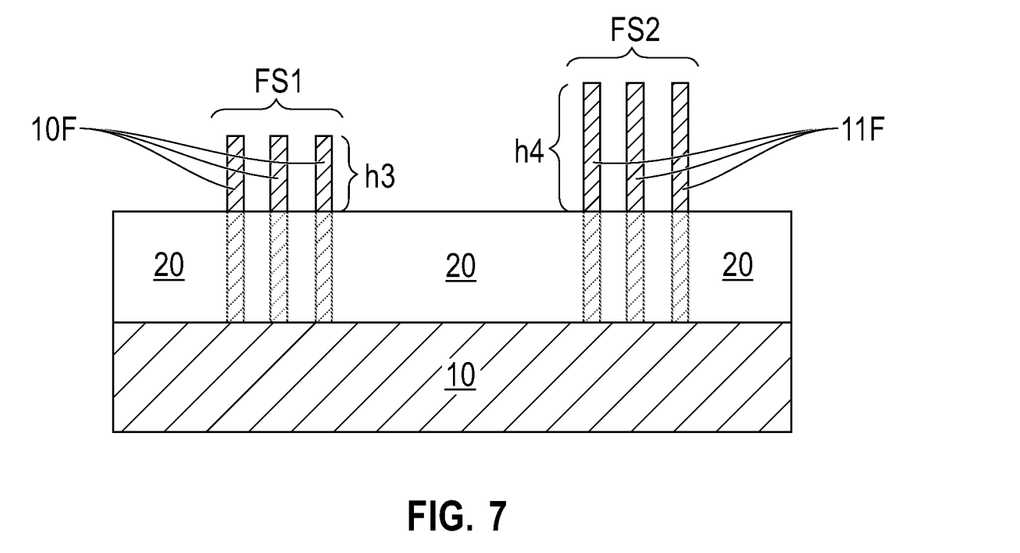
FIG. 7 is a cross sectional view of the exemplary semiconductor structure of FIG. 6 after removing the entirety of the upper fin portion from the at least one semiconductor fin stack to provide at least one first fin structure composed entirely of the lower fin portion composed of the first semiconductor material.

Referring now to FIG. 7, there is illustrated the exemplary semiconductor structure of FIG. 6 after removing the entirety of the upper fin portion 16F from the at least one semiconductor fin stack, S1, to provide at least one first fin structure, FS1, composed entirely of the lower fin portion 10F composed of the first semiconductor material. The removal of the entirety of the upper fin portion 16F may be performed utilizing an etching process that is selective for removing the second semiconductor material.

The at least one first fin structure, FS1, has a first active fin, i.e., channel, height, h3, and the at least one second fin structure, FS2, has a second active fin, i.e., channel, height, h4, that is greater than the first active fin height, h3. The active fin height (or channel fin height) is defined from the topmost surface of the isolation structure 20 to the topmost surface of the first and second fin structures (FS1, FS2).

Figure 8:
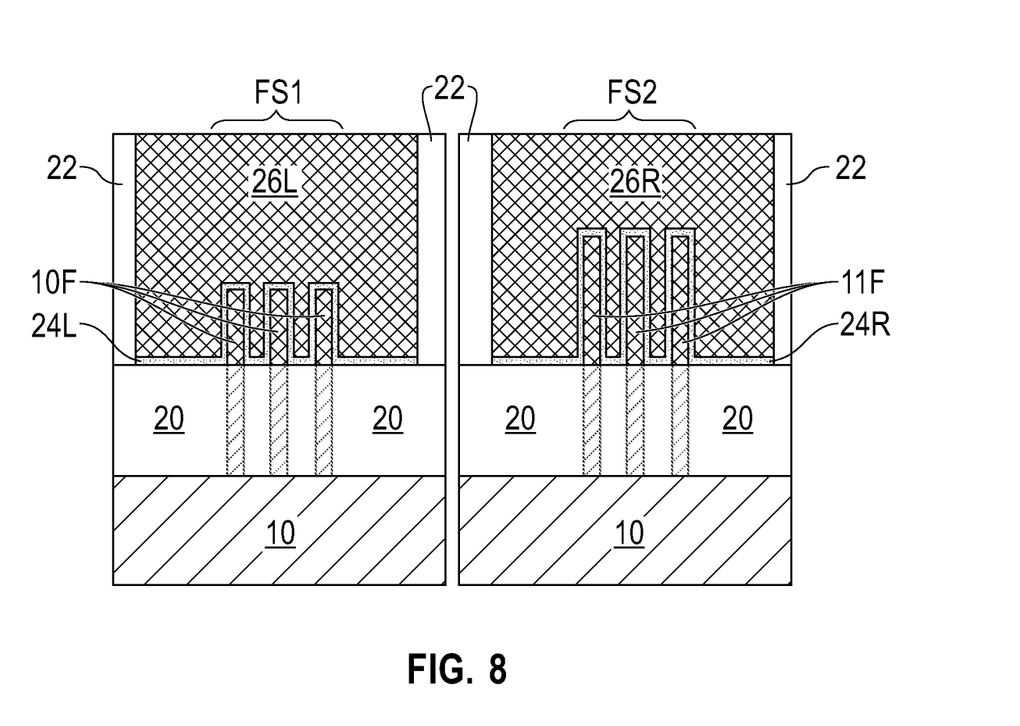
FIG. 8 is a cross sectional view of the exemplary semiconductor structure of FIG. 7 after further device processing including functional gate formation.

Referring now to FIG. 8, there is illustrated the exemplary semiconductor structure of FIG. 7 after further device processing including functional gate structure formation. By "functional gate structure" it is meant a permanent gate structure used to control output current (i.e., flow of carriers in the channel) of a semiconducting device through electrical or magnetic fields.

The first device processing includes a gate last process which includes forming a first sacrificial gate structure (not shown) straddling the at least one first fin structure, FS1, and a second sacrificial gate structure (not shown) straddling the at least one second fin structure, FS2. The first and second sacrificial gate structures may be formed and include materials that are well known to those skilled in the art. After formation of the first and second sacrificial gate structures, a dielectric structure 22 is formed. The dielectric structure 22 may include a gate spacer in contact with the sacrificial gate structure, and an interlayer dielectric (ILD) material laterally adjacent to the gate spacer.

The gate spacer that is present in the dielectric structure 22 may include any dielectric spacer material such as, for example, silicon dioxide, or silicon nitride. The gate spacer may be formed utilizing a deposition process followed by a spacer etch.

The ILD material that is present in the dielectric structure 22 may include undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0. In one embodiment, the ILD material can be formed by a deposition process such as, for example, chemical vapor deposition (CVD), plasma enhanced chemical vapor deposition (PECVD), evaporation or spin-on coating. A planarization process may follow the deposition of the ILD material.

After formation of the dielectric structure 22, the first and second sacrificial gate structure are removed to define gate cavities that expose the respective fin structures. In one embodiment, the removal of the first and second sacrificial gate structures may be performed simultaneously. In another embodiment, the removal of the first and second sacrificial gate structures may be performed in separate removal steps. In such an embodiment, a functional gate structure may be formed in one region first, and then another functional gate structure can be formed in the other region.

In either embodiment, a functional gate structure is formed in each of the gate cavities. In the present application, a first functional gate structure (24L, 26L) is formed on the exposed surfaces of each first fin structure, FS1, and on a topmost surface of the isolation structure 20, and a second functional gate structure (24R, 26R) is formed on the exposed surfaces of each second fin structure, FS2. The first functional gate structure (24L, 26L) includes a first gate dielectric material 24L and a first gate electrode material 26L, and the second functional gate structure includes a second gate dielectric material 24R and a second gate electrode material 26R.

The first and second gate dielectric materials (24L, 24R) may composed of any gate dielectric material such as, for example, an oxide, nitride, and/or oxynitride. In one example, the first and second gate dielectric materials (24L, 24R) can be composed of a high-k material having a dielectric constant greater than 4.0. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the first and second gate dielectric materials (24L, 24R). In some embodiments, the first and second gate dielectric materials (24L, 24R) are composed of a same gate dielectric material. In other embodiments, the first and second gate dielectric materials (24L, 24R) are composed of compositionally different gate dielectric materials. In one embodiment, the first and second gate dielectric materials (24L, 24R) can have a thickness in a range from 1 nm to 10 nm. Other thicknesses that are lesser than, or greater than, the aforementioned thickness range can also be employed for the first and second gate dielectric materials (24L, 24R).

The first and second gate electrode materials (26L, 26R) may be composed of a conductive material such as, for example, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g., $Ti_3Al$, ZrAl), TaC, TaMgC, carbon nanotube, conductive carbon, graphene, or any suitable combination of these materials. The conductive material may further comprise dopants that are incorporated during or after deposition. In some embodiments, the first and second gate electrode materials (26L, 26R) are composed of a same gate electrode material. In other embodiments, the first and second gate electrode materials (26L, 26R) are composed of compositionally different gate electrode materials.

In some embodiments, a work function setting layer (not shown) may be formed between the gate dielectric material and the gate electrode material of the first and second functional gate structures. The work function setting layer may include any suitable work function metal (WFM) containing material. Illustrative examples of WFM containing materials that can be employed include, but are not limited to, a nitride, such as, for example, titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN), a carbide, such as, for example, titanium carbide (TiC) titanium aluminum carbide (TiAlC), tantalum carbide (TaC), hafnium carbide (HfC), and combinations thereof.

The first and second functional gate structure can be formed be deposition of a gate stack that includes a gate dielectric material, an optional work function setting layer, and a gate electrode material, and then planarizing the gate stack. After formation of the first and second functional gate structures, the dielectric structure 22 laterally surrounds the first functional gate structure and the second functional gate structure, and the dielectric structure 22 has a topmost surface that is coplanar with a topmost surface of the first functional gate structure and a topmost surface of the second functional gate structure.

Notably, FIG. 8 illustrates a semiconductor structure that includes a first FinFET device (far left hand side) for low power applications and a second FinFET device (far right hand side) for non-low power applications. The first FinFET device has an active fin height, i.e., channel height, h3, that is less that an active fin height, h4, of the second FinFET device. The active fin height adjustment is achieved utilizing an isolation structure 20 that has a constant height in the region including the first FinFET device and the region including the second FinFET device.

More specifically, FIG. 8 illustrates a semiconductor structure that includes at least one first fin structure, FS1, located in a first region of a semiconductor substrate 10, and at least one second fin structure, FS2, located in a second region of the semiconductor substrate 10. The semiconductor structure further includes an isolation structure 20 located on the semiconductor substrate 10 and laterally surrounding a lower portion of the first fin structure, FS1, and a lower portion of the second fin structure, FS2. As mentioned above, the isolation structure 20 has a constant thickness across the first region and the second region, and the at least one first fin structure, FS, has a first active fin height, h3, and the at least one second fin structure, FS2, has a second active fin height, h4, that is greater than the first active height, h3.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, the method comprising:
   forming an opening in a first region of a semiconductor substrate composed of a first semiconductor material;
   forming a second semiconductor material that is compositionally different from the first semiconductor material of the semiconductor substrate in the opening, wherein the second semiconductor material has a topmost surface that is coplanar with a topmost surface of the semiconductor substrate;
   forming at least one semiconductor fin stack including a lower fin portion composed of the first semiconductor material and an upper fin portion composed of the second semiconductor material in the first region of the semiconductor substrate, and at least one second fin structure composed entirely of a fin portion composed of the first semiconductor material in a second region of the semiconductor substrate;
   forming an isolation structure surrounding a bottom portion of the at least one semiconductor fin stack and a bottom portion of the at least one second fin structure; and
   removing the upper fin portion entirely from the at least one semiconductor fin stack to provide at least one first fin structure in the first region, wherein the at least one first fin structure has a first active fin height that is less than an active fin height of the at least one second fin structure.

2. The method of claim 1, wherein the isolation structure has a constant thickness across the first region and the second region.

3. The method of claim 1, wherein the first semiconductor material is composed of silicon, and the second semiconductor material is composed of a silicon germanium alloy.

4. The method of claim 1, wherein the forming of the opening comprises:
   forming a hard mask layer on the semiconductor substrate; and
   lithography patterning the hard mask layer and an upper portion of the semiconductor substrate.

5. The method of claim 1, wherein the forming of the second semiconductor material comprises epitaxial growth and planarization.

6. The method of claim 1, wherein the forming of the at least one semiconductor fin stack and the at least one second fin structure comprises a patterning process.

7. The method of claim 1, wherein the removing of the upper fin portion from the at least one semiconductor fin stack comprises a selective etching process.

8. The method of claim 1, wherein the at least one first fin structure and the at least one second fin structure are entirely composed of the first semiconductor material.

9. The method of claim 1, wherein the at least one first fin structure has a first total fin height and the at least one second fin structure has a second total fin height that is greater than the first total fin height.

10. The method of claim 1, further comprising forming a first functional gate structure on the isolation structure and contacting an upper portion of the at least one first fin structure, and a second functional gate structure on the isolation structure and contacting an upper portion of the at least one second fin structure.

11. The method of claim 10, further comprising forming a dielectric structure laterally surrounding the first functional gate structure and the second functional gate structure.

* * * * *